(12) United States Patent
Chiu et al.

(10) Patent No.: US 11,917,837 B2
(45) Date of Patent: Feb. 27, 2024

(54) METHOD OF FORMING THE SEMICONDUCTOR DEVICE

(71) Applicant: Winbond Electronics Corp., Taichung (TW)

(72) Inventors: Yung-Han Chiu, Taichung (TW); Shu-Ming Li, Taichung (TW); Po-Yen Hsu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 66 days.

(21) Appl. No.: 17/897,221

(22) Filed: Aug. 29, 2022

(65) Prior Publication Data

US 2022/0406846 A1    Dec. 22, 2022

Related U.S. Application Data

(62) Division of application No. 17/165,949, filed on Feb. 3, 2021, now Pat. No. 11,476,305.

(51) Int. Cl.
*H10B 63/00* (2023.01)
*H10N 70/00* (2023.01)
*H10N 70/20* (2023.01)

(52) U.S. Cl.
CPC .......... *H10B 63/80* (2023.02); *H10N 70/011* (2023.02); *H10N 70/24* (2023.02); *H10N 70/826* (2023.02); *H10N 70/841* (2023.02); *H10N 70/8833* (2023.02)

(58) Field of Classification Search
CPC ............................... H10B 63/00; H10N 70/00
See application file for complete search history.

(56) References Cited

U.S. PATENT DOCUMENTS

| | | | |
|---|---|---|---|
| 10,276,633 B1 * | 4/2019 | Hung | H10B 61/00 |
| 10,297,750 B1 * | 5/2019 | Ando | H10N 70/24 |
| 2018/0097173 A1 * | 4/2018 | Chuang | H10N 50/10 |
| 2018/0108837 A1 * | 4/2018 | Hsu | H10N 70/063 |
| 2018/0331282 A1 * | 11/2018 | Zhu | H10N 70/20 |
| 2020/0020849 A1 * | 1/2020 | Tien | G11C 11/161 |
| 2020/0075855 A1 * | 3/2020 | Tseng | H10N 70/24 |

* cited by examiner

*Primary Examiner* — Marvin Payen
(74) *Attorney, Agent, or Firm* — JCIPRNET

(57) ABSTRACT

A method of forming the semiconductor device is provided. The method includes following steps. A memory structure is formed over a first conductive line over a substrate and is electrically connected to the first conductive line. A sacrificial layer is formed on the memory structure. A spacer layer is formed to cover the memory structure and the sacrificial layer. A first dielectric layer is formed to cover the spacer layer. A planarization process is performed to remove a portion of the first dielectric layer. A second dielectric layer is formed on the spacer layer and the first dielectric layer. A patterning process is performed to form an opening exposing a portion of the top surface of the sacrificial layer. The sacrificial layer is removed to form a recess. A second conductive line is formed in the opening and the recess to be electrically coupled to the memory structure.

10 Claims, 14 Drawing Sheets

US 11,917,837 B2

METHOD OF FORMING THE SEMICONDUCTOR DEVICE

CROSS-REFERENCE TO RELATED APPLICATION

This application is a divisional application of and claims the priority benefit of U.S. patent application Ser. No. 17/165,949, filed on Feb. 3, 2021, now allowed. The entirety of the above-mentioned patent application is hereby incorporated by reference herein and made a part of specification.

BACKGROUND

Technical Field

The embodiments of the disclosure relate to a method of forming the semiconductor device, and particularly relates to a method of forming the memory device.

Description of Related Art

Memory device is widely used in various electronic devices. Among various memory devices, resistive random access memory (RRAM) device has become a type of non-volatile memory that is widely studied in recent years, due to its fast operation speed and low power consumption. Generally, an RRAM device has a transistor and a memory structure electrically coupled to the transistor. A conductive via and a conductive line are usually disposed above the memory structure, and the conductive line is electrically coupled to the memory structure through the conductive via.

During traditional manufacturing process of memory device, after the memory structure is formed, an etching process (e.g., reactive ion etching (RIE)) is usually used to pattern the dielectric material on the memory stack structure, so as to form a via hole that exposes the memory stack structure, and a conductive via is formed in the via hole. A dielectric layer and a conductive line embedded in the dielectric layer are then formed on the conductive via. However, in the traditional process, during the process of forming the via hole by etching, the upper part (such as, the upper electrode) of the memory structure may be exposed to the etching plasma and thus be damaged by the etching process, thereby affecting the reliability of the memory device.

SUMMARY

The embodiments of the disclosure provide a semiconductor device including a memory and method for forming the same, which can improve the endurance and reliability of the memory device.

The embodiments of the disclosure provides a method of forming a semiconductor device, including: forming a first conductive line on a substrate; forming a memory structure over the first conductive line, the memory structure is electrically connected to the first conductive line through a conductive via; forming a sacrificial layer on the memory structure; forming a spacer layer to cover a sidewall of the memory structure and a sidewall and a top surface of the sacrificial layer; forming a first dielectric layer to cover the spacer layer; performing a planarization process to at least remove a portion of the first dielectric layer over a topmost surface of the spacer layer; forming a second dielectric layer on the spacer layer and the first dielectric layer; performing a patterning process to form an opening at least penetrating through the second dielectric layer, and the opening exposes a portion of the top surface of the sacrificial layer; removing the sacrificial layer to form a recess; and forming a second conductive line in the opening and the recess to electrically couple to the memory structure.

In view of above, the embodiments of the disclosure form a sacrificial layer on the memory structure, and then perform an etching process to form a conductive line trench on the memory structure. The sacrificial layer can be used as an etching stop layer, and protects the underlying memory structure from being damaged during etching process, thereby improving the endurance and reliability of the resulted memory device.

DESCRIPTION OF THE EMBODIMENTS

FIG. 1A to FIG. 1K illustrate a method of forming a semiconductor device according to some embodiments of the disclosure. FIG. 2A to FIG. 2C illustrate the enlarged view of the region R1 in FIG. 1K according to some embodiments of the disclosure.

Figure 1A:
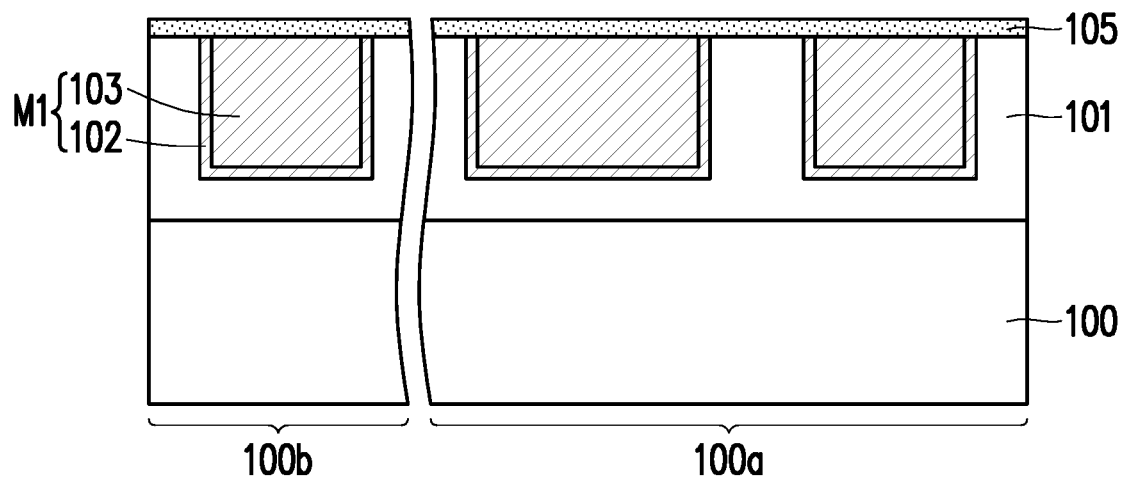
FIG. 1A to FIG. 1K are cross-sectional views illustrating a method of forming a semiconductor device according to some embodiments of the disclosure.
Figure 2A:
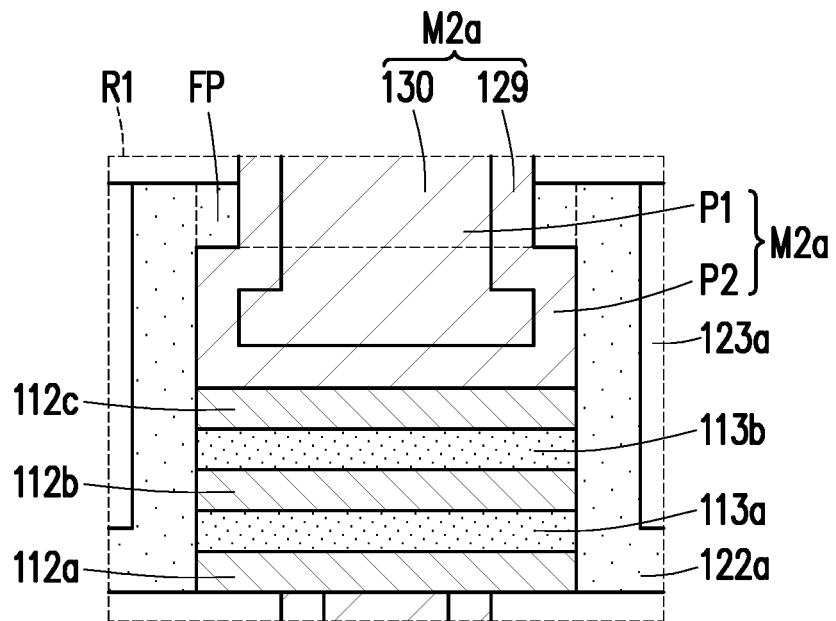
FIG. 2A to FIG. 2C illustrates an enlarged view of a region R1 of FIG. 1K according to some embodiments of the disclosure.
Figure 2B:
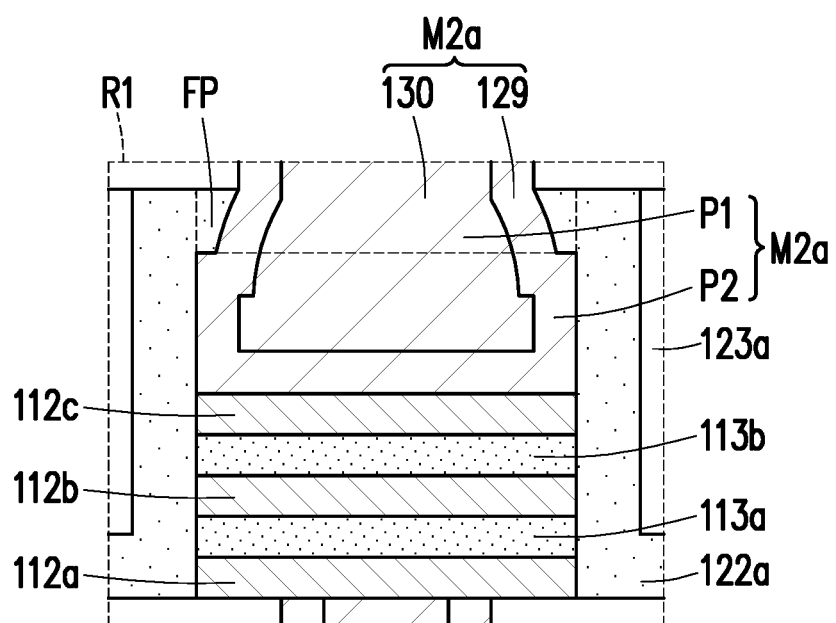
Figure 2C:
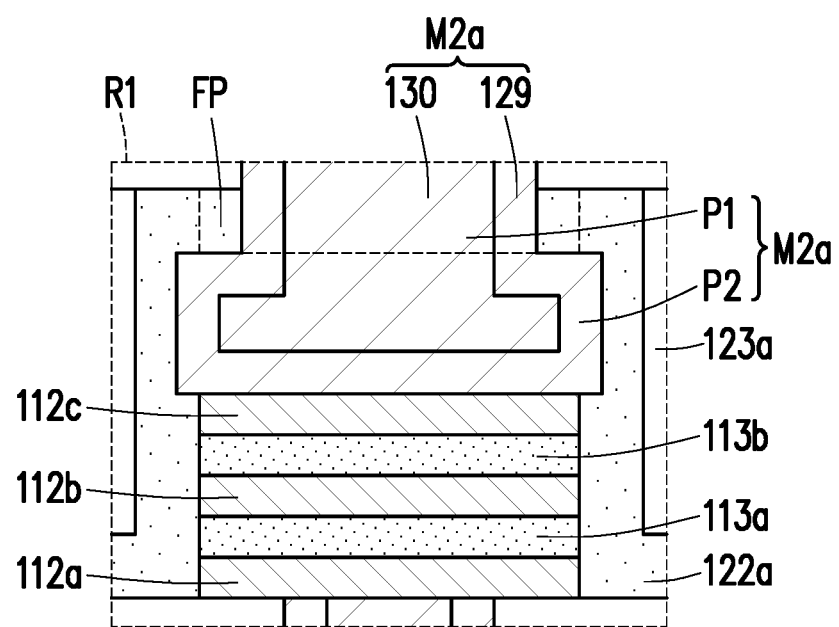

Referring to FIG. 1A, a substrate 100 is provided. The substrate 100 may be a semiconductor substrate. For example, the semiconductor substrate may include a silicon substrate. The silicon substrate may be undoped silicon substrate or a doped silicon substrate. The doped silicon substrate may be an N-type doped silicon substrate or a P-type doped silicon substrate.

In some embodiments, the substrate 100 includes a first region 100a and a second region 100b. The first region 100a is, for example, a memory region for forming a memory device. The second region 100b is a peripheral region, such as a logic circuit region. A plurality of devices (not shown) may be formed in and/or on the substrate 100. The devices may be, for example, active devices, passive devices or combinations thereof. In some embodiments, the devices include transistors, such as metal-oxide-semiconductor field-effect transistor (MOSFET). The transistor may include a gate disposed on the substrate 100, a gate dielectric layer disposed between the gate and the substrate 100, and source/drain regions disposed in the substrate 100 and on opposite sides of the gate.

A dielectric layer 101 is formed on the substrate 100. The dielectric layer 101 may be a single layer or a multi-layer structure. The dielectric layer 101 may include a suitable dielectric material such as silicon oxide, and may be formed by a suitable deposition process such as chemical vapor deposition (CVD). The dielectric layer 101 is formed on the substrate 100 and covers the devices (e.g., transistors) on the substrate 100.

Still referring to FIG. 1A, a plurality of conductive lines M1 are formed in the dielectric layer 101. The conductive lines M1 each include a barrier layer 102 and a conductive layer 103. The material of the barrier layer 102 may include titanium, tantalum, titanium nitride, tantalum nitride, the like, or combinations thereof. The material of the conductive layer 103 includes metal or metal alloy, such as copper, tungsten, aluminum, alloys thereof, the like, or combinations thereof. In some embodiments, the barrier layer 102 is located between the dielectric layer 101 and the conductive layer 103, surrounding and covering the sidewalls and the bottom surface of the conductive layer 103.

In some embodiments, the forming method of the conductive line M1 includes the following processes: the dielectric layer 101 is patterned to form a plurality of conductive line trenches in the dielectric layer 101 by, for example, photolithography and etching processes; Thereafter, a barrier material and a conductive material are formed on the top surface of the dielectric layer 101 and in the trench by using a suitable process such as a deposition process (e.g., CVD, physical vapor deposition (PVD)) or electroplating); A planarization process (e.g., chemical mechanical polishing (CMP)) is performed to remove excess portions of the barrier material and the conductive material over the top surface of the dielectric layer 101, and the barrier material and conductive material remaining in the trench constitute the conductive line M1. In some embodiments, the top surfaces of the barrier layer 102 and the conductive layer 103 of the conductive line M1 are substantially level with the top surface of the dielectric layer 101.

In some embodiments, the dielectric layer 101 further includes a plurality of conductive features (not shown), such as conductive contacts, conductive vias and/or conductive lines formed therein. The conductive features are located below the conductive lines M1 and electrically connect the conductive lines M1 to the devices formed on the substrate 100. For example, in the first region 100a, the conductive line M1 may be electrically connected to the transistor on the substrate 100 through the conductive contact underlying thereof. In some embodiments, the conductive contact lands on a drain region of the transistor.

Still referring to FIG. 1A, an etching stop layer 105 is formed on the dielectric layer 101 and the conductive lines M1. The material of the etching stop layer 105 is different from the material of the dielectric layer 101. In some examples, the etching stop layer 105 may include silicon nitride, silicon oxynitride, silicon carbo-nitride, or combinations thereof. The forming method of the etching stop layer 105 may include a suitable deposition process such as CVD.

Figure 1B:
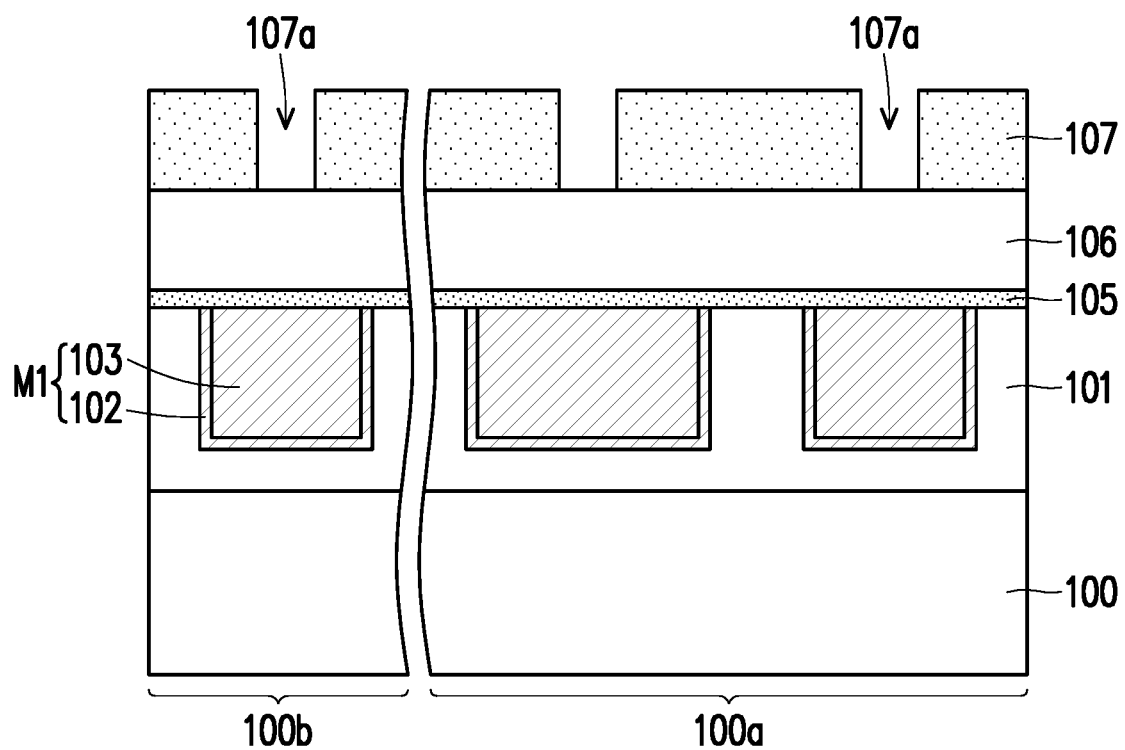

Referring to FIG. 1B, a dielectric layer 106 is formed on the etching stop layer 105. The material of the dielectric layer 106 may be similar to the material of the dielectric layer 101, such as silicon oxide, silane, the like, or combinations thereof. The forming method of the dielectric layer 106 may include CVD. A patterned mask layer 107 is formed on the dielectric layer 106. The patterned mask layer 107 includes a plurality of mask openings 107a to expose portions of the top surface of the dielectric layer 106. The patterned mask layer 107 is used to define via holes in the dielectric layer 106 and the etching stop layer 105. In some embodiments, the patterned mask layer 107 may be or include a patterned photoresist, and may be formed by a photolithography process.

Figure 1C:
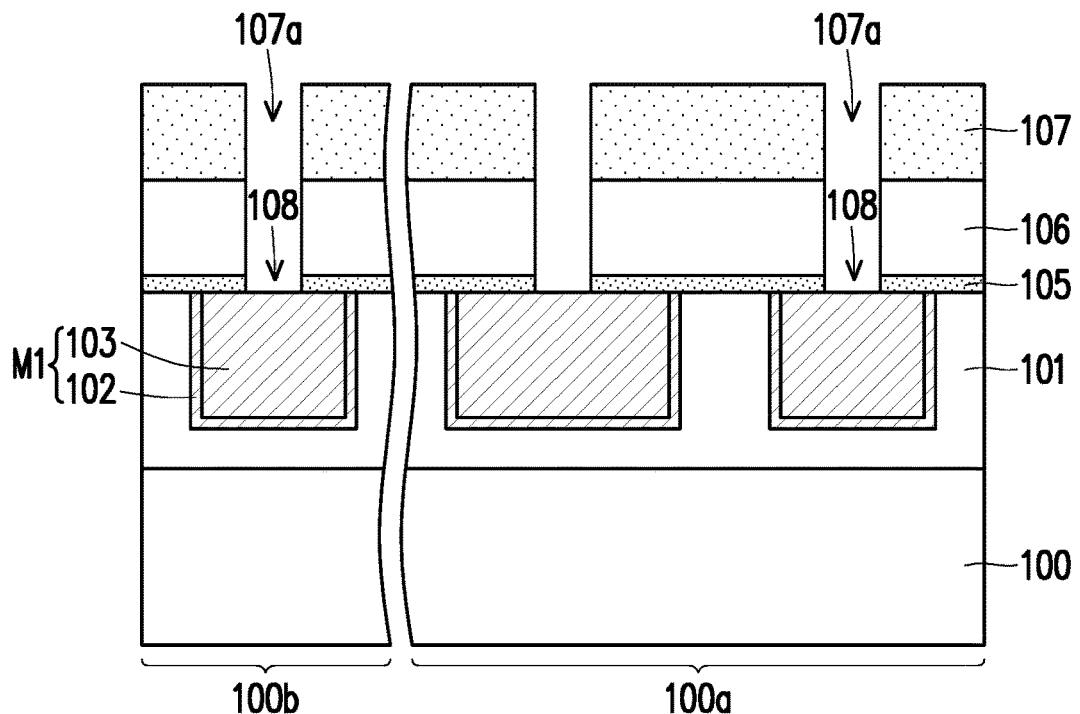

Referring to FIG. 1C, an etching process is performed using the patterned mask layer 107 as an etching mask, so as to remove portions of the dielectric layer 106 and the etching stop layer 105 exposed by the mask openings 107a, and a plurality of openings 108 are formed in the dielectric layer 106 and the etching stop layer 105. The openings 108 penetrate through the dielectric layer 106 and the etching stop layer 105 to expose portions of the top surface of the conductive lines M1. In some embodiments, the openings 108 may be via holes.

Figure 1D:
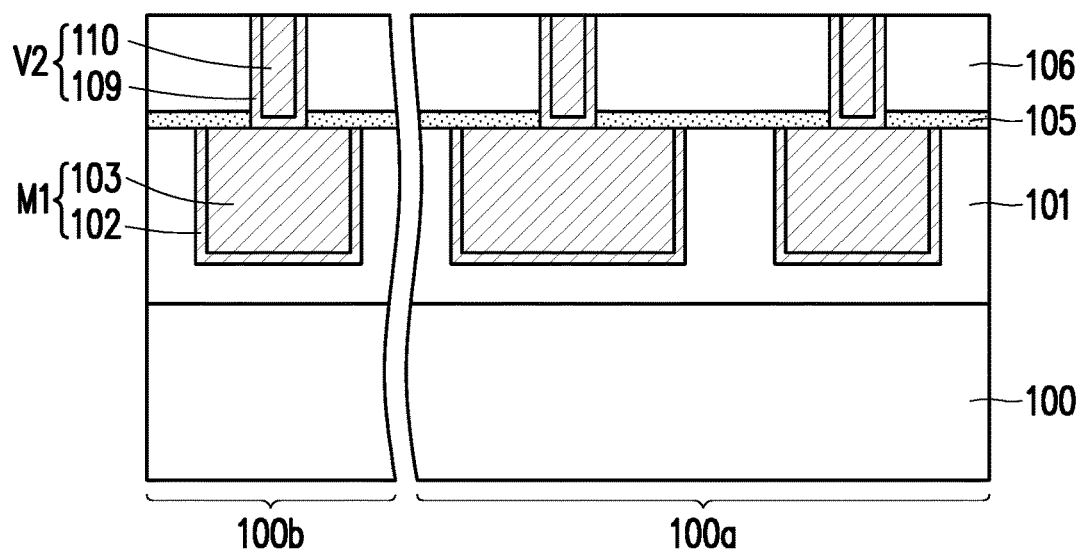

Referring to FIG. 1C and FIG. 1D, the patterned mask layer 107 is removed using a process such as ashing or stripping, for example. Thereafter, conductive vias V2 are formed in the via holes 108 to be electrically connected to the conductive lines M1. In some embodiments, the conductive via V2 includes a barrier layer 109 and a conductive post 110. The materials of the barrier layer 109 and the conductive post 110 may be respectively selected from the same candidate materials for the barrier layer 102 and the conductive layer 103, and may be the same as or different from the materials of the barrier layer 102 and the conductive layer 103, respectively. In some embodiments, the conductive post 110 and the conductive layer 103 use different metal materials. For example, the conductive layer 103 includes copper, and the conductive post 110 includes tungsten. However, the disclosure is not limited to this.

In some embodiments, the forming method of the conductive via V2 includes the following processes: a barrier material and a conductive material are formed (e.g., deposited) on the top surface of the dielectric layer 106 and in the via hole 108; thereafter, a planarization process (e.g., CMP) is performed to remove excess portions of the barrier material and the conductive material on the top surface of the dielectric layer 106, and remaining the barrier layer 109 and the conductive post 110 in the via hole 108 to form the conductive via V2. In some embodiments, the top surfaces of the barrier layer 109 and the conductive post 110 of the conductive via V2 are substantially level with the top surface of the dielectric layer 106.

Figure 1E:
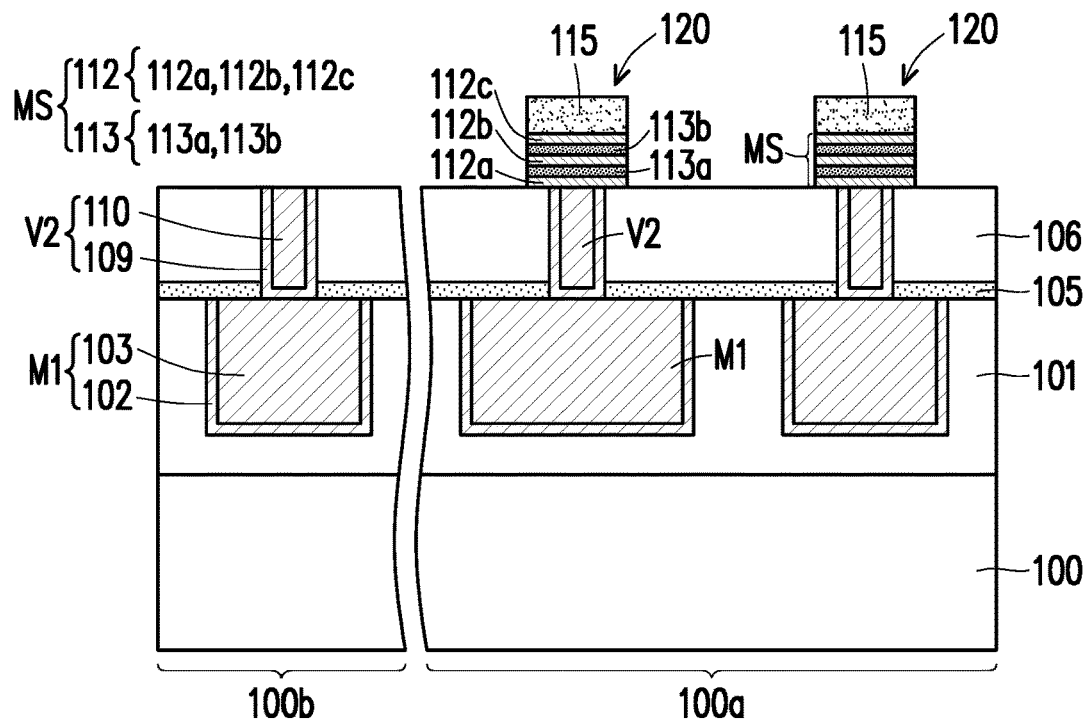

Referring to FIG. 1E, a plurality of stack structures 120 are formed on the dielectric layer 106 and the conductive vias V2 in the first region 100a. The stack structure 120 includes a memory structure MS and a sacrificial layer 115 formed on the memory structure MS. In some embodiments, the memory structure MS is, for example, a data storage structure applied for a resistive random access memory (RRAM) device. That is, the memory structure MS may be a resistor structure. The memory structure MS is electrically coupled to the source/drain region of the transistor on the substrate 100 through the conductive via V2 and the conductive line M1. The respective memory structure MS and the corresponding transistor constitute a memory cell. In some embodiments, the memory cell has a 1-transistor-1-resistor (1T1R) configuration, and forms an RRAM cell. However, the disclosure is not limited thereto.

In some embodiments, the memory structure MS is a stack structure including a plurality of electrode layers 112 and dielectric layers 113 stacked alternately. For example, the memory structure MS may include a first electrode layer 112a, a first dielectric layer 113a, a second electrode layer 112b, a second dielectric layer 113b, and a third electrode layer 112c stacked from bottom to top (the electrode layers 112a, 112b, 112c may be collectively referred to as electrode layers 112; the dielectric layers 113a and 113b may be collectively referred to as dielectric layers 113). The dielectric layer 113 is sandwiched between two corresponding electrode layers. In some embodiments, the bottommost electrode layer 112a may be referred to as a lower electrode or a bottom electrode, and the topmost electrode layer 112c may be referred to as an upper electrode or a top electrode.

Although FIG. 1E uses three electrode layers 112 and two dielectric layers 113 as an example to illustrate the memory structure MS, the numbers of electrode layers and dielectric layers included in the memory structure MS are not limited thereto. The memory structure MS at least includes two electrode layers and a dielectric layer sandwiched between the two electrode layers. For example, the second dielectric layer 113b and the third electrode layer 112c may be optionally formed, and may be omitted in some embodiments. In these embodiments, the memory structure MS may merely include the first electrode layer 112a, the first dielectric layer 113a, and the second electrode layer 112b from bottom to top. In some other embodiments, the memory structure MS may include more dielectric layers and electrode layers alternately stacked on the third electrode layer 112c.

The material of the electrode layer 112 may include metal, metal nitride, the like, or combinations thereof. For example, the electrode layer 112 may include titanium, titanium nitride, tantalum, tantalum nitride, platinum, tungsten, ruthenium or combinations thereof, or other suitable metallic materials. The materials of different electrode layers 112 may be the same or different. In some embodiments, the first electrode layer 112a and the third electrode layer 112c include titanium, while the second electrode layer 112b includes titanium nitride. However, the disclosure is not limited thereto.

In some embodiments, the material of the dielectric layer 113 includes a variable resistance dielectric material, and may also be referred to as a variable resistance layer. The variable resistance dielectric material includes, for example, a metal oxide, such as hafnium oxide ($HfO_x$), tungsten oxide ($WO_x$), the like or combinations thereof.

The sacrificial layer 115 is formed on the topmost layer (e.g., the third electrode layer 112c) of the memory structure MS to cover the top surface of the electrode layer 112c at the top of the memory structure MS. In some embodiments, the sacrificial layer 115 may also be referred to as a protection layer or a cap layer. The material of the sacrificial layer 115 may include a suitable material different from the materials of the electrode layer 112 and the subsequently formed spacer layer and dielectric layer. In some embodiments, the sacrificial layer 115 includes a semiconductor material, such as polysilicon. However, the disclosure is not limited to this.

Still referring to FIG. 1E, in some embodiments, the forming method of the memory structure MS and the sacrificial layer 115 includes the following processes: the electrode material layers and dielectric material layers for the memory structure MS and sacrificial material layer are sequentially formed on the dielectric layer 106 and the conductive vias V2 by suitable deposition processes (e.g., CVD, PVD), respectively; Thereafter, the sacrificial material layer, the electrode material layers and the dielectric material layers are patterned by photolithography and etching process, so as to form the stack structure 120 including the memory structure MS and the sacrificial layer 115 in the first region 100a. In some embodiments, the sidewalls of the respective electrode layers 112 and the dielectric layers 113 of the memory structure MS and the sidewall of the sacrificial layer 115 are substantially aligned in a direction perpendicular to the top surface of the substrate 100. However, the disclosure is not limited thereto.

Figure 1F:
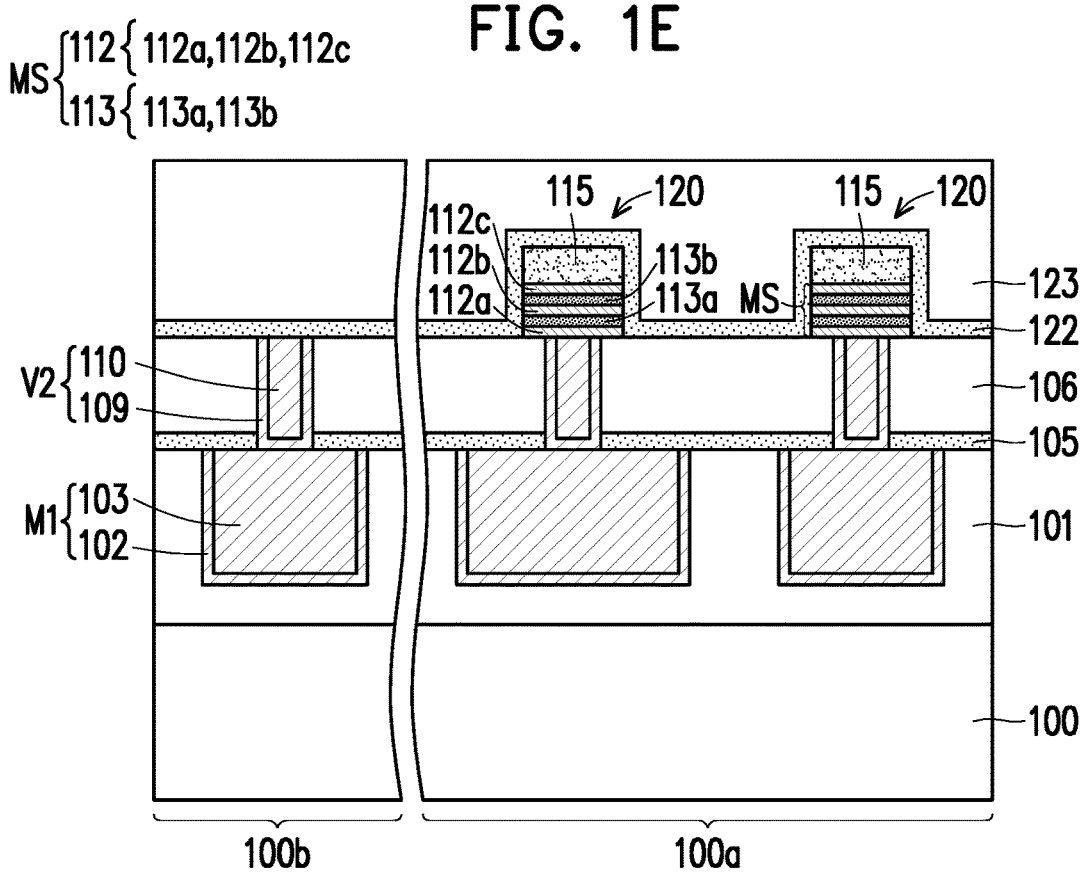

Referring to FIG. 1F, a spacer layer 122 and a dielectric layer 123 are formed over the substrate 100. The spacer layer 122 covers the top surface of the dielectric layer 106 and the top surfaces and sidewalls of the plurality of stack structures 120. In some embodiments, the spacer layer 122 is conformally formed on the dielectric layer 106 and the stack structures 120. The spacer layer 122 includes a dielectric material, such as silicon oxide, silicon nitride, silicon oxynitride, silicon carbo-nitride, the like or combinations thereof, and may be formed by a suitable deposition process such as CVD, atomic layer deposition (ALD). The spacer layer 122 may also be referred to as a spacer material layer.

The dielectric layer 123 is formed on the spacer layer 122 and covers the surface of the spacer layer 122. The dielectric layer 123 may include, for example, a dielectric material such as silicon oxide, and may be formed by a deposition process such as CVD, high-density plasma (HDP) CVD. The material of the dielectric layer 123 and the material of the spacer layer 122 may be similar or different. In some embodiments, the spacer layer 122 may be used as a stop layer (e.g., CMP stop layer or etching stop layer) in subsequent processes.

Figure 1G:
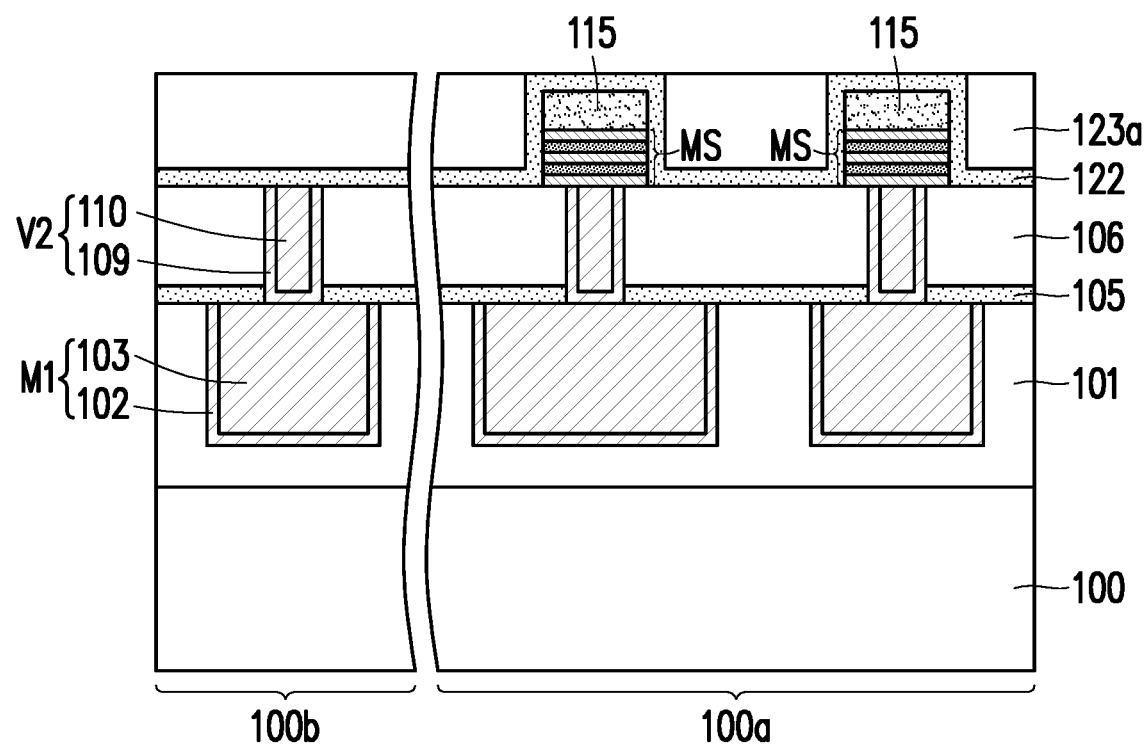

Referring to FIG. 1F to FIG. 1G, in some embodiments, a planarization process (e.g., CMP) is performed to at least remove a portion of the dielectric layer 123, and a dielectric layer 123a is formed. In some embodiments, the planarization process is performed to remove a portion of the dielectric layer 123 over the topmost surface of the spacer layer 122, until the topmost surface of the spacer layer 122 is exposed. That is, the spacer layer 122 serves as a CMP stop layer. In some embodiments, after the planarization process is performed, the dielectric layer 123a is located on and laterally aside the spacer layer 122, and the top surface of the dielectric layer 123a is substantially level with the top surface of the spacer layer 122. However, the disclosure is not limited thereto.

Figure 1H:
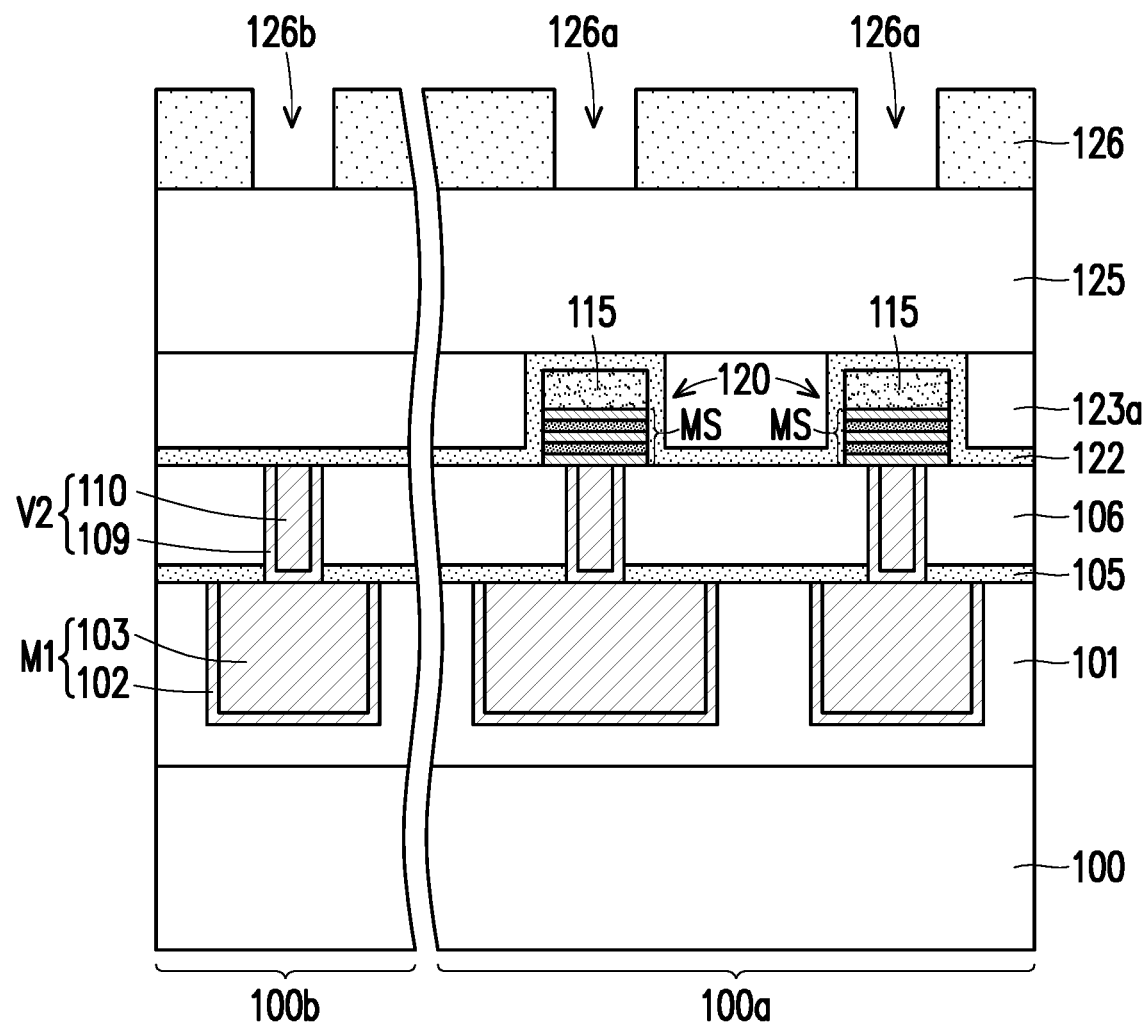

Referring to FIG. 1H, a dielectric layer 125 is formed on the dielectric layer 123a by a deposition process (e.g., CVD), for example. The dielectric layer 125 may include silicon oxide. A patterned mask layer 126 is then formed on the dielectric layer 125. The patterned mask layer 126 may include a patterned photoresist and has a plurality of mask openings 126a and 126b to expose portions of the top surface of the dielectric layer 125. In some embodiments, the mask openings 126a are located within the first region 100a, and at least a portion of the mask opening 126a is located directly over the stack structure 120. The mask opening 126b is located within the second region 100b, and at least a portion of the mask opening 126b is located directly over the conductive via V2. In some embodiments, the mask openings 126a and 126b are trenches extending in a direction perpendicular to the paper, and are used to define conductive line trenches.

Figure 1I:
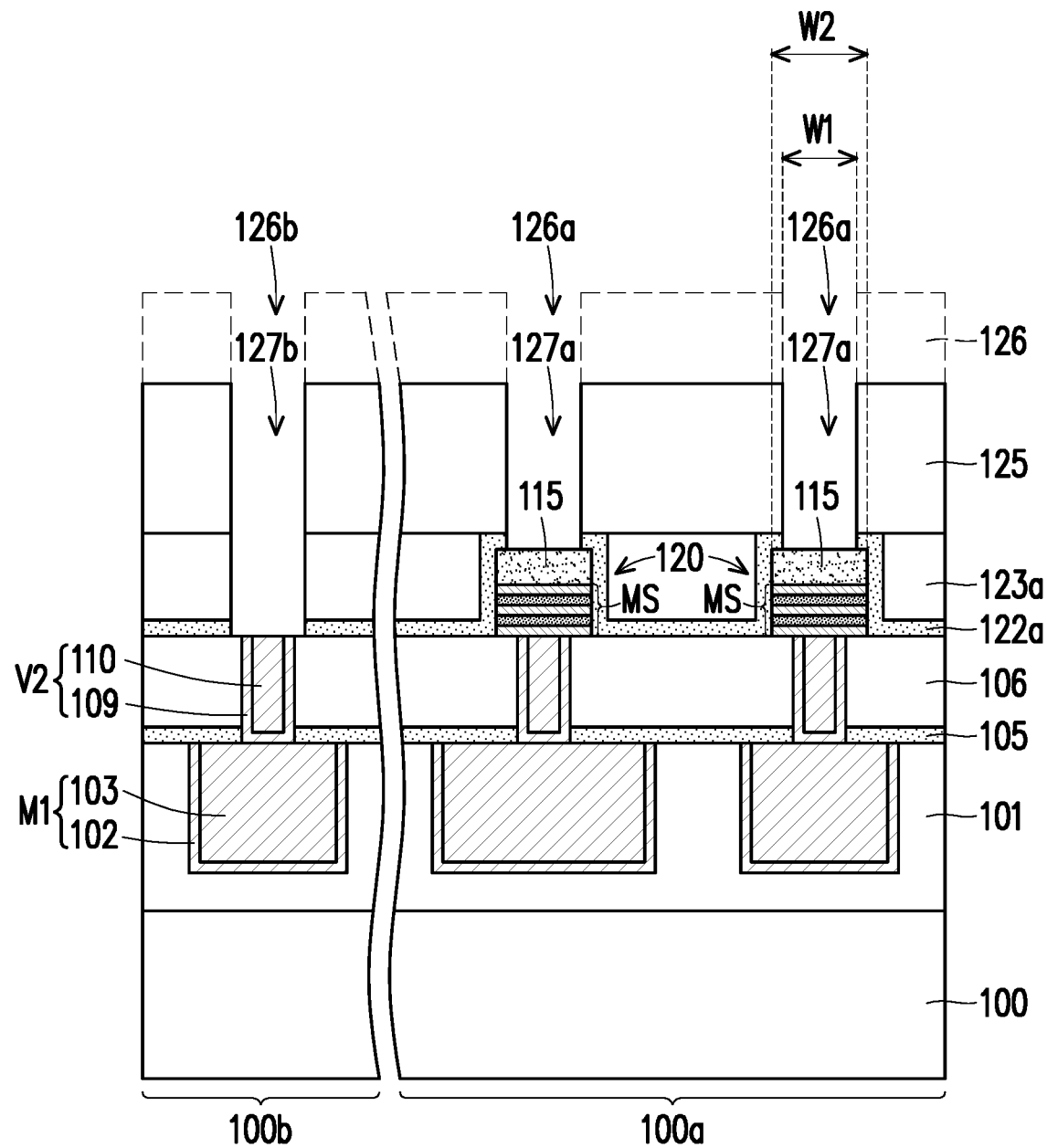

Referring to FIG. 1H and FIG. 1I, an etching process (e.g., reactive ion etching (RIE)) is performed using the patterned mask layer 126 as an etching mask, so as to form openings 127a and 127b. In some embodiments, the spacer layer 122 serves as an etching stop layer, and the etching process is performed until the spacer layer 122 exposed by the mask openings 127a/127b is removed, and a spacer layer 122a is formed. In the first region 100a, the etching process removes portions of the dielectric layer 125 and portions of the spacer layer 122 exposed by the mask openings 126a, and openings 127a are formed. In the second region 100b, the etching process removes a portion of the dielectric layer 125, a portion of the dielectric layer 123a, and a portion of the spacer layer 122 exposed by the mask opening 126b, and an opening 127b is formed. In some embodiments, the openings 127a and 127b are conductive line trenches and at least partially extend in a direction perpendicular to the paper. The opening 127a is located in the first region 100a and penetrates through the dielectric layer 125 and the spacer layer 122a to expose a portion of the top surface of the sacrificial layer 115 of the stack structure 120. The opening 127b is located in the second region 100b and penetrates through the dielectric layer 125, the dielectric layer 123a and the spacer layer 122a to expose the top surface of the conductive via V2 and a portion of the top surface of the dielectric layer 106.

In some embodiments, the width of the mask opening 126a is less than the width of the stack structure 120, such that the width W1 of the formed opening 127a is less than the width W2 of the stack structure 120. After the etching process, a portion of the top surface of the sacrificial layer 115 is exposed by the opening 127a, and another portion (e.g., the edge portion) of the top surface of the sacrificial layer 115 is covered by the spacer layer 122a and the overlying dielectric layer 125. In some embodiments, the width of the mask opening 126b and the width of the opening 127b defined by the mask opening 126b may be larger than the width of the corresponding conductive via V2.

In the above-mentioned etching process, since the sacrificial layer 115 is disposed on the memory structure MS, the memory structure MS can be prevented from being exposed to etching plasma, and therefore the sacrificial layer 115 can protect the underlying memory structure MS from being damaged by the etching process. After the etching process, the patterned mask layer 126 is removed by a process such as ashing or stripping. In some embodiments, a cleaning process may be further performed to remove by-products and/or residues that may be generated during the etching process and/or removal process of the patterned mask layer 126.

Figure 1J:
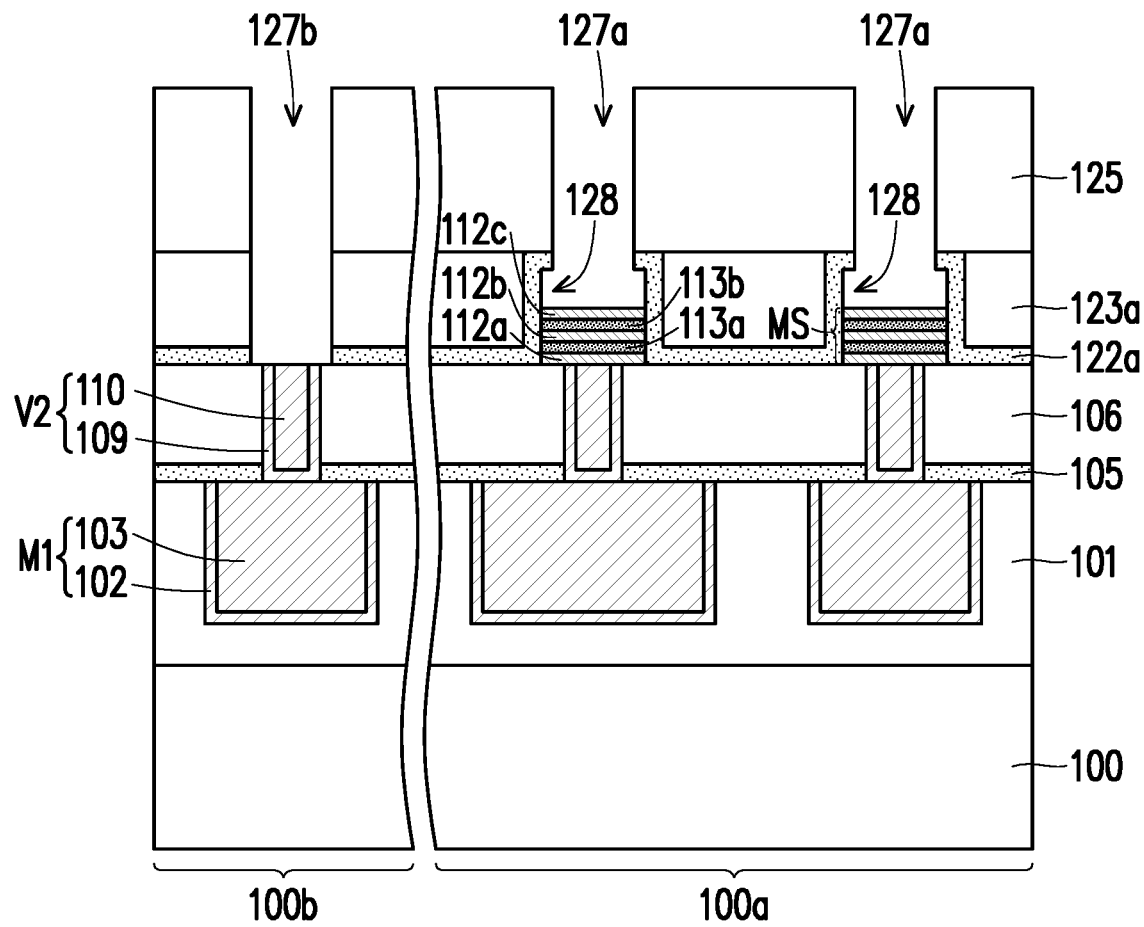

Referring to FIG. 1I and FIG. 1J, the sacrificial layers 115 are removed to form recesses 128 at the position previously occupied by the sacrificial layers 115, and the recesses 128 expose the memory structures MS. In some embodiments, the sacrificial layer 115 is removed by an etching process, such as a wet etching process. The etching process has a high etching selectivity ratio of the sacrificial layer 115 to memory structure MS (e.g., electrode layer 112), and may have high etching selectivity ratio of the sacrificial layer 115 to other adjacent layers (e.g., dielectric layer 125, spacer layer 122a). For example, the etchant used for the wet etching process may include Rezi-38, but the disclosure is not limited thereto. In some embodiments, the entire layer of the sacrificial layer 115 (including the portion covered by the spacer layer) is completely removed, while the other layers adjacent to the sacrificial layer 115 is substantially not removed. Since the wet etching process does not use etching plasma and has a high etching selectivity ratio of the sacrificial layer 115 to the memory structure MS, the etching process does not cause damage to the memory structure MS. In some embodiments, the spacer layer 122a may be slightly damaged in the process of removing the sacrificial layer 115 and a small portion of the spacer layer 122a may be removed. In some other embodiments, the spacer layer 122a is substantially not removed. In some embodiments, after the sacrificial layer 115 is removed, a cleaning process may be further performed to remove by-products and/or residues that may be generated from the etching process. The cleaning process may use Sc1 cleaning solution, for example.

Referring to FIG. 1J, in some embodiments, after the sacrificial layer 115 is removed, portions of the spacer layer 122a hang over the memory structure MS, and the recesses 128 are formed below the openings 127a and between the memory structures MS and the spacer layer 122a. The recess 128 or a portion of the recess 128 may also be referred to as a gap between the memory structure MS and the overlying spacer layer 122a. The recess 128 is spatially connected to the opening 127a, and is defined by the top surface of the memory structure MS and portions of the sidewall and the bottom surface of the spacer layer 122a. In some embodiments, the width of the recess 128 is substantially equal to the width of the memory structure MS and larger than the width of the opening 127a. In some other embodiments in which the spacer layer 122a may be partially removed by the etching process, the width of the recess 128 may be slightly larger than the width of the memory structure MS.

Figure 1K:
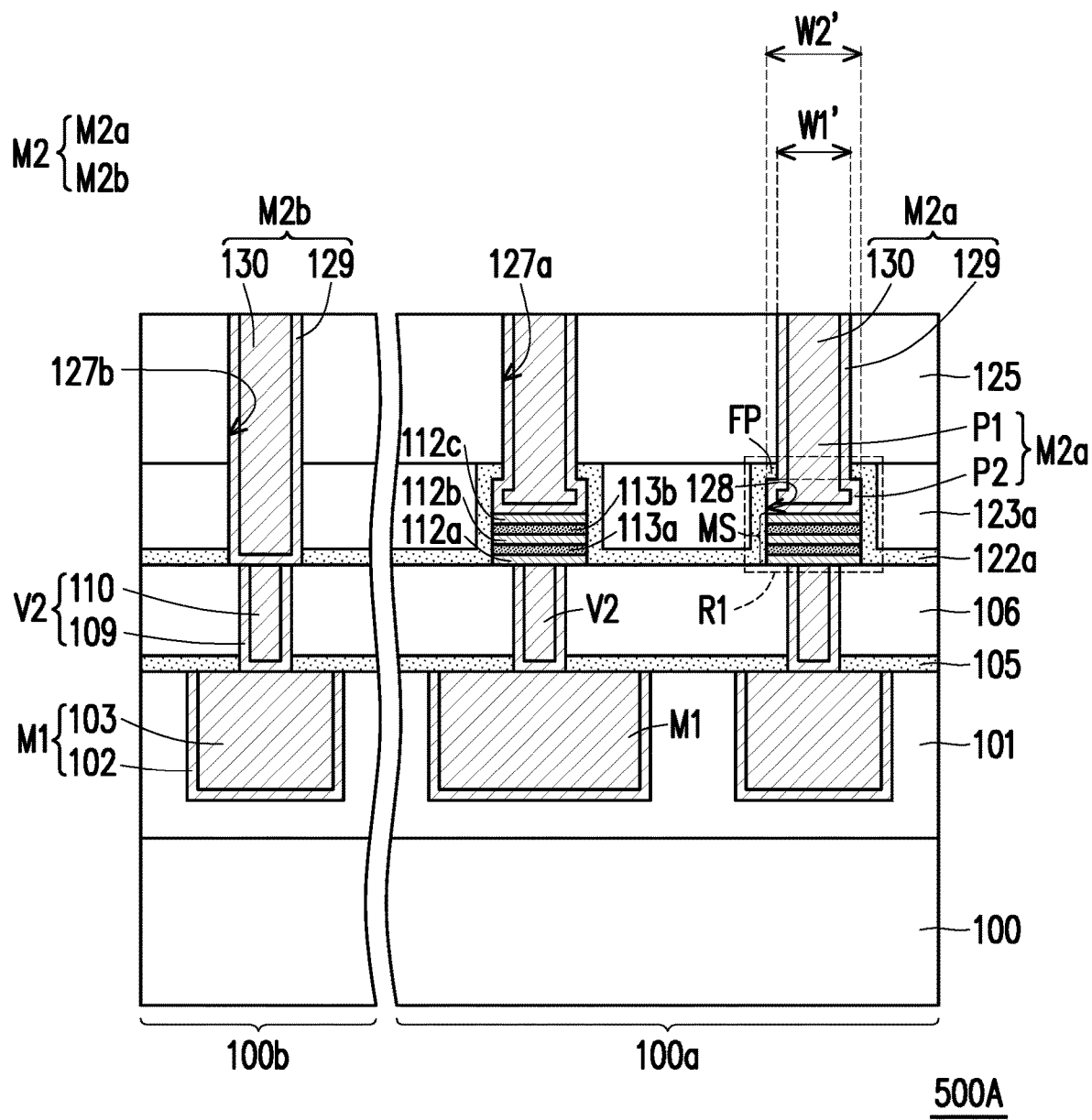

Referring to FIG. 1K, conductive lines M2 are formed in the openings 127a, 127b and the recess 128. The conductive lines M2 include conductive lines M2a located in the openings 127a and recesses 128, and the conductive line M2b located in the opening 127b. The conductive line M2a is electrically connected to and in physical contact with the top electrode 112c of the memory structure MS. The conductive line M2b is electrically connected to and in physical contact with the conductive via V2. In some embodiments, the conductive lines M2 each include a barrier layer 129 and a conductive layer 130. The material and forming method of the conductive line M2 are similar to those of the conductive line M1. For example, the formation of the conductive line M2 may include the following processes: after the recesses 128 are formed, a barrier material and a conductive material are formed on the substrate 100 to cover the surface of the dielectric layer 125 and filling into the openings 127a, 127b and the recesses 128. Then, a planarization process (e.g., CMP) is performed to remove the excess portions of the barrier material and conductive material on the top surface of the dielectric layer 125, and the barrier layers 129 and the conductive layers 130 remaining in the openings 127a and recesses 128 constitute the conductive layers M2a, while the barrier layer 129 and the conductive layer 130 remaining in the opening 127b constitute the conductive line M2b. In some embodiments, the top surfaces of the barrier layer 129 and the conductive layer 130 of the conductive line M2 are substantially level with the top surface of the dielectric layer 125.

Still referring to FIG. 1K, as such, a semiconductor device 500A is thus formed. In some embodiments, the semiconductor device 500A includes the substrate 100, the conductive lines M1 embedded in the dielectric layer 101, the conductive vias V2, the memory structures MS, and conductive lines M2a and M2b. The conductive vias V2 are embedded in and penetrating through the dielectric layer 101 and the etching stop layer 105, and are electrically connected to the conductive lines M1. The memory structures MS and the conductive lines M2a are located in the first region 100a, and are electrically coupled to the conductive lines M1 through the conductive vias V2. The conductive line M2b is located in the second region 100b, and penetrates through the dielectric layers 125, 123a and the spacer layer 122a to be electrically connected to the conductive via V2.

The memory structure MS is disposed on the dielectric layer 106 and the conductive via V2, and is surrounded by the spacer layer 122a. In some embodiments, a portion FP of the spacer layer 122a overlies the topmost surface of the memory structure MS (e.g., the top surface of the electrode layer 112c), and is spaced apart from the topmost surface of the memory structure MS by a non-zero distance. The portion FP of the spacer layer 122a may also be referred to as an overlying part FP. In other words, there is a gap existed between the overlying part FP of the spacer layer 122a and the topmost surface of the memory structure MS. In some embodiments, the cross-sectional shape of the overlying part FP of the spacer layer 122a may be square, rectangle, or the like, as shown in the enlarged view FIG. 2A, but the disclosure is not limited thereto. In some other embodiments, the overlying part FP of the spacer layer 122a may be partially removed during the process of removing the sacrificial layer 115, and therefore, the cross-sectional shape of the overlying part FP may be trapezoid, triangle, the like, or other suitable shape, and the surface of the overlying part FP contacting the conductive line M2a may be inclined or arced, as shown in the enlarged view FIG. 2B.

In some embodiments, the conductive line M2a penetrates through the dielectric layer 125, the dielectric layer 123a, and the spacer layer 122a, and fills into the gap between the spacer layer 122a and the memory structure MS, so as to be in physical contact with and electrically connected to the electrode layer 112c of the memory structure MS. In other words, the conductive line M2a has a body part P1 and an extension part P2 underlying the body part P1. In some embodiments, the body part P1 is embedded in the dielectric layer 125, the dielectric layer 123a, and the overlying part FP of the spacer layer 122a. The extension part P2 is located between the body part P1 and the memory structure MS, laterally protruding from the sidewall of the body part P1 and extends to the position between the overlying part FP of the spacer layer 122a and the memory structure MS. That is to say, the overlying part FP of the spacer layer 122a and the topmost surface of the memory structure MS are separated by the extension part P2 of the conductive line M2a therebetween. In this embodiment, the top surface of the extension part P2 is covered by the overlying part FP of the spacer layer 122a, and is lower than the top surface of the spacer layer 122a and the top surface of the dielectric layer 123a.

In some embodiments, the body part P1 is, for example, line-shaped, and at least partially extends in a direction perpendicular to the paper, and is in physical contact with the sidewalls of the dielectric layer 125, the dielectric layer 123a, and the overlying part FP of the spacer layer 122a. The extension part P2 is located on the memory structure MS, and is in physical contact with and electrically connected to the electrode layer 112c. In some embodiments, the stack including the memory structure MS and the extension part P2 is configured as a pillar structure and is surrounded and covered by the spacer layer 122a. The sidewalls and a portion (e.g., the edge portion) of the top surface of the extension part P2 is in physical contact with the spacer layer 122a. In some embodiments, when viewed from a top view (not shown), the memory structure MS and the extension part P2 may be circular shaped, oval shaped, the like, or other suitable shaped, and the vertical extending portion of the spacer layer 122a may be ring-shaped, surrounding, covering and contacting the sidewalls of the memory structure MS and the extension part P2. The "ring-shaped" may include a circular ring shaped, oval ring shaped, or other types of ring shaped.

The width W1' of the body part P1 is less than the width W2' of the extension part P2. Herein, the widths of the body part P1 and the extension part P2 refers to their width in a direction perpendicular to the extending direction of the body part P1 (e.g., a direction parallel with the paper and parallel with the top surface of the substrate 100). In some embodiments, the width W2' of the extension part P2 of the conductive line M2a is substantially equal to the width of the memory structure MS, and the sidewall of the extension part P2 is substantially aligned with the sidewall of the memory structure MS in a direction perpendicular to the top surface of the substrate 100. However, the disclosure is not limited thereto. In some embodiments in which a portion of the spacer layer 122a is also removed during the removal of sacrificial layer 115, the width of recess 128 may be greater than the width of memory structure MS, so that the extension part P2 of conductive line M2a formed in the recess 128 has a width larger than the width of the memory structure MS, as shown in the enlarged view FIG. 2C. In other words, the extension part P2 may laterally protrude from the sidewall of the memory structure MS, and the portion of the extension part P2 protruding from the memory structure MS may be embedded in the spacer layer 122a.

FIG. 3A to FIG. 3D are cross-sectional views illustrating a method of forming a semiconductor device according to some other embodiments of the disclosure. This embodiment is similar to the foregoing embodiment, except that: in this embodiment, the planarization process illustrated in FIG. 1F to FIG. 1G stops at the sacrificial layer 115.

Figure 3A:
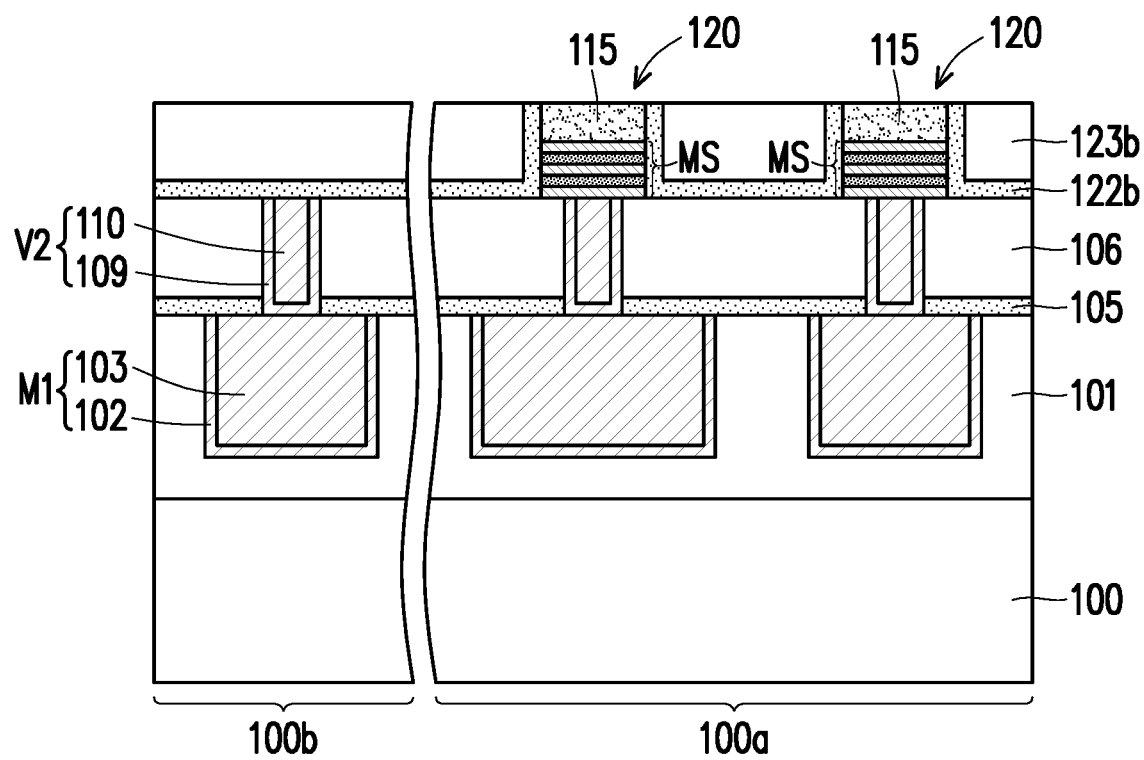
FIG. 3A to FIG. 3D are cross-sectional views illustrating a method of forming a semiconductor device according to some other embodiments of the disclosure.

Referring to FIG. 1F and FIG. 3A, in some embodiments, after the dielectric layer 123 is formed, a planarization process (e.g., CMP) is performed to remove a portion of the dielectric layer 123 and a portion of the spacer layer 122 over the top surface of the stack structure 120, thereby forming the spacer layer 122b and the dielectric layer 123b laterally aside the stack structure 120. After the planarization process, the top surface of the sacrificial layer 115 is exposed, and the top surface of the dielectric layer 123b and the top surface of the spacer layer 122b are substantially level with the top surface of the sacrificial layer 115.

Figure 3B:
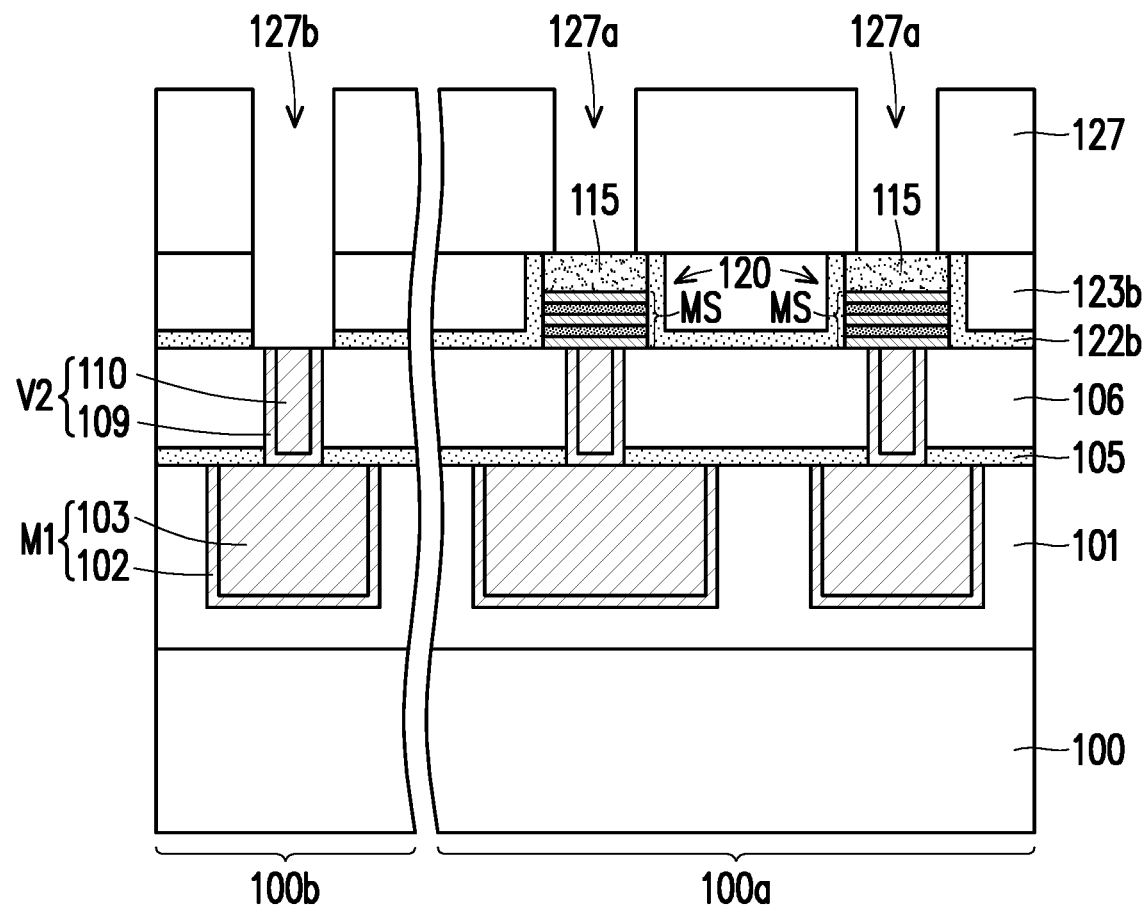

Referring to FIG. 3B, a dielectric layer 125 is formed on the stack structure 120, the dielectric layer 123b, and the spacer layer 122b. Thereafter, openings 127a are formed in the dielectric layer 125 within the first region 100a, so as to expose a portion of the top surface of the sacrificial layer 115; and an opening 127b is formed in the dielectric layers 125, 123b and spacer layer 122b within the second region 100b, so as to expose the top surface of the conductive via V2 and a portion of the top surface of the dielectric layer 106. The openings 127a and 127b may be formed by, for example, photolithography and etching processes. The openings 127a and 127b are, for example, trenches. In some embodiments, the openings 127a and 127b may be formed simultaneously or separately.

Figure 3C:
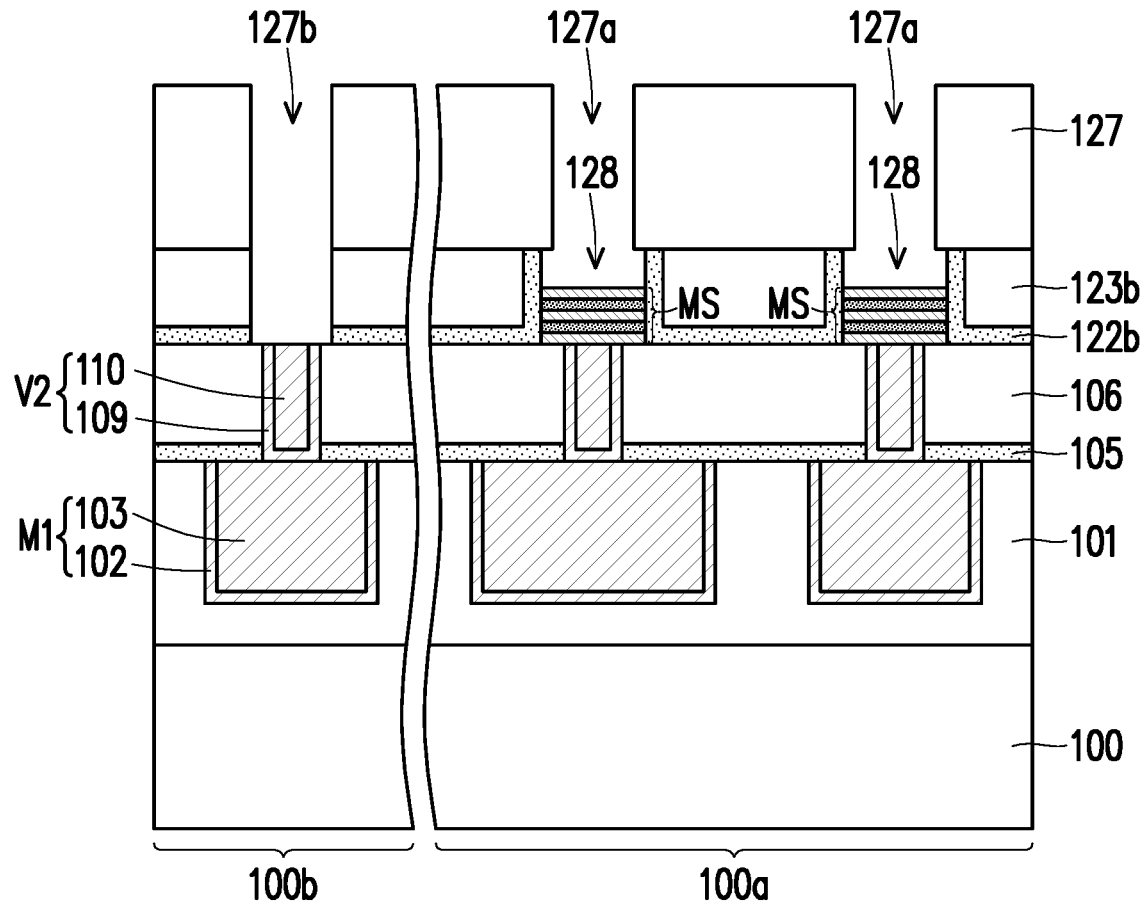

Referring to FIG. 3B and FIG. 3C, the sacrificial layers 115 are removed by, for example, wet etching, so as to form recesses 128 underlying the openings 127a. The recesses 128 are spatially connected to the openings 127a, and are located between the memory structures MS and the dielectric layer 125. The recess 128 is defined by the top surface of the memory structure MS, the sidewall of the spacer layer 122b, and the bottom surface of the dielectric layer 125. After the sacrificial layer 115 is removed, a cleaning process may be performed to remove by-products and/or residues that may be generated during the etching process.

Figure 3D:
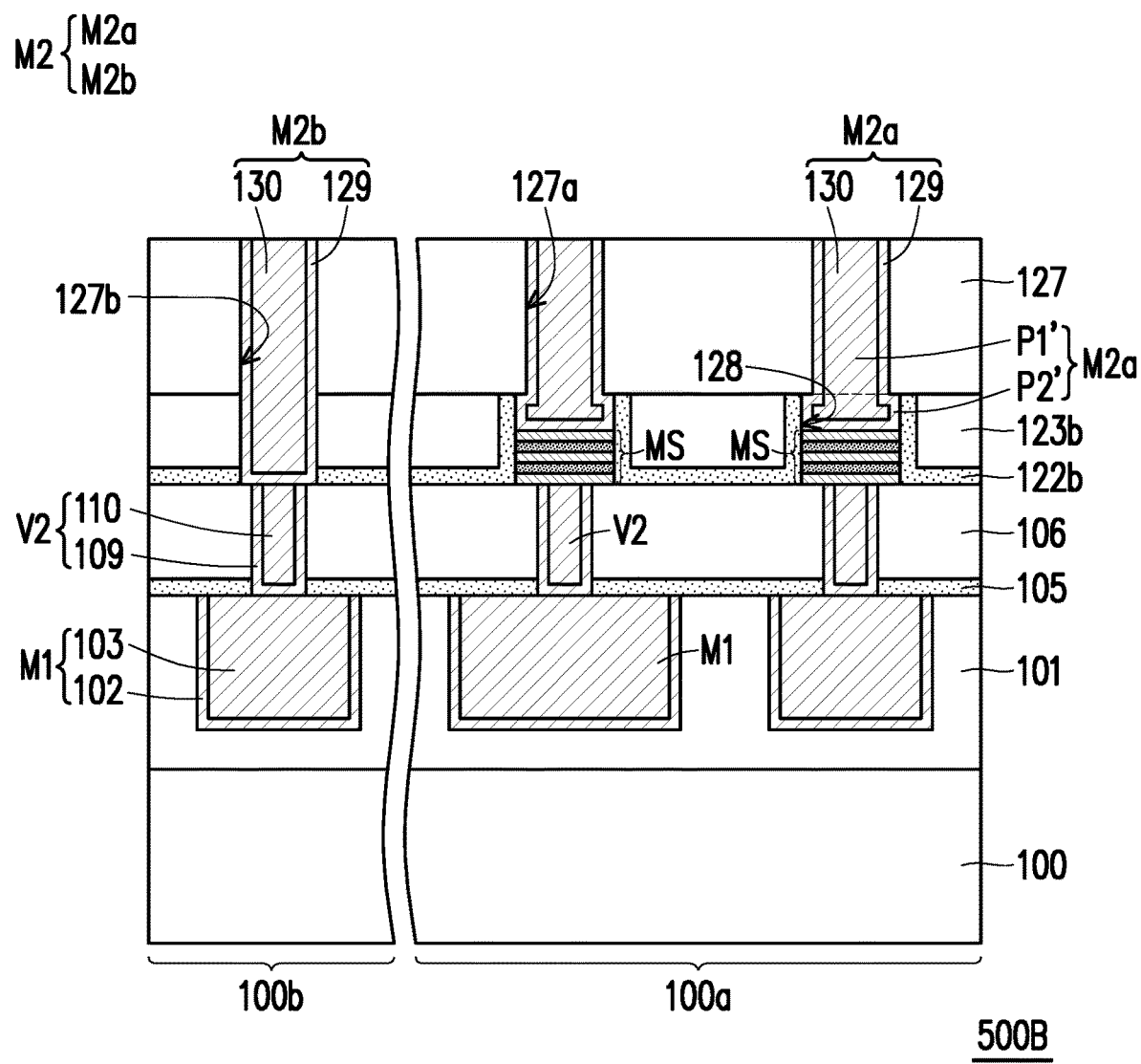

Referring to FIG. 3D, conductive lines M2a are formed in the openings 127a and the recesses 128, and a conductive line M2b is formed in the opening 127b. As such, the formation of a semiconductor device 500B is thus completed. In the semiconductor device 500B, the spacer layer 122b does not have the overlying part described in the foregoing embodiment. The conductive line M2a is filled in the recess 128 and is in contact with the bottom surface of the dielectric layer 125.

The conductive line M2a has a body part P1' and an extension part P2' underlying the body part P1' and laterally protruding from the sidewall of the body part P1'. In this embodiment, the body part P1' is embedded in the dielectric layer 125. The extension part P2' is located between the memory structure MS and the body part P1', and between the memory structure MS and the dielectric layer 125. The portion of the extension part P2' protruding from the body part P1' is in contact with the sidewall of the spacer layer 122b and the bottom surface of the dielectric layer 125. In some embodiments, the top surface of the extension part P2' is substantially level with the top surface of the spacer layer 122b and the top surface of the dielectric layer 123b. Other features of the semiconductor device 500B are similar to those of the semiconductor device 500A in FIG. 1L, which are not described again here.

In the foregoing embodiments, the concept of the disclosure is explained by using an example that the memory structure MS is a memory structure of an RRAM device, but the disclosure is not limited thereto. The concept of the disclosure may also be applied to other types of memory devices, such as dynamic random access memory (DRAM). For example, in some embodiments, the material of the variable resistance layer in the memory structure MS may be replaced with a dielectric material (e.g., a high-k dielectric material), such that the memory structure forms a capacitor and is electrically coupled to the transistor on the substrate, so as to form a DRAM device.

In the embodiments of the disclosure, after the sacrificial layer is formed on the memory structure, an etching process (e.g., RIE) is performed to form a conductive line trench on the memory structure, and the etching process stops on the sacrificial layer. In this way, the RIE process used to form the via hole exposing the memory structure in the traditional method is omitted, and during the etching process used to form the conductive line trench of the disclosure, the sacrificial layer can prevent the underlying memory structure from being exposed to etching plasma, thereby protecting the memory structure from being damaged by etching plasma. Therefore, the performance (e.g., endurance and reliability) of the resulted memory device can be improved, and the yield of product can be improved.

Although the disclosure has been described with reference to the above embodiments, the disclosure is not limited to the embodiments, it will be apparent to one of ordinary skill in the art that modifications to the described embodiments may be made without departing from the spirit of the disclosure. Accordingly, the scope of the disclosure is defined by the attached claims.

What is claimed is:

1. A method of forming a semiconductor device, comprising:
    forming a first conductive line over a substrate;
    forming a memory structure over the first conductive line, and the memory structure is electrically connected to the first conductive line through a conductive via;
    forming a sacrificial layer on the memory structure;
    forming a spacer layer to cover a sidewall of the memory structure, and a sidewall and a top surface of the sacrificial layer;
    forming a first dielectric layer to cover the spacer layer;
    performing a planarization process to at least remove a portion of the first dielectric layer over a topmost surface of the spacer layer;
    forming a second dielectric layer on the spacer layer and the first dielectric layer;
    performing a patterning process to form an opening at least penetrating through the second dielectric layer, and the opening exposes a portion of the top surface of the sacrificial layer;
    removing the sacrificial layer to form a recess; and
    forming a second conductive line in the opening and the recess to be electrically coupled to the memory structure.

2. The method of claim 1, wherein after the planarization process, a topmost surface of the spacer layer is level with a top surface of the first dielectric layer.

3. The method of claim 1, wherein the patterning process removes a portion of the second dielectric layer and a portion of the spacer layer, and the opening is formed in the second dielectric layer and the spacer layer.

4. The method of claim 1, wherein the planarization process further comprises: removing a portion of the spacer layer on the top surface of the sacrificial layer to expose the top surface of the sacrificial layer.

5. The method of claim 4, wherein after the planarization process, a top surface of the first dielectric layer and the top surface of the spacer layer are substantially level with the top surface of the sacrificial layer.

6. The method of claim 1, wherein the sacrificial layer is removed by a wet etching process.

7. The method of claim 1, wherein a width of the opening is formed to be less than a width of the sacrificial layer, so that the width of the opening is less than a width of the recess formed from removing the sacrificial layer, and the second conductive line includes a body part located in the opening, and an extension part located in the recess, and the extension part laterally protrudes from a sidewall of the body part.

8. The method of claim 7, wherein a portion of the extension part protruding from the body part is located between the memory structure and the second dielectric layer.

9. The method of claim 7, wherein a top surface of the extension part of the second conductive line is level with or lower than the topmost surface of the spacer layer and the top surface of the first dielectric layer.

10. The method of claim 1, wherein the memory structure comprises a resistive random access memory structure, and at least comprises a lower electrode, an upper electrode, and a variable resistance layer disposed between the upper electrode and the lower electrode.

* * * * *